United States Patent
Raja

(10) Patent No.: US 7,208,958 B2
(45) Date of Patent: Apr. 24, 2007

(54) ANTENNA FOR DETECTION OF PARTIAL DISCHARGES IN A CHAMBER OF AN ELECTRICAL INSTRUMENT

(75) Inventor: Kuppuswamy Raja, Paris (FR)

(73) Assignee: Areva T&D SA, Paris (FR)

( * ) Notice: Subject to any disclaimer, the term of this patent is extended or adjusted under 35 U.S.C. 154(b) by 0 days.

(21) Appl. No.: 10/546,060

(22) PCT Filed: Feb. 25, 2004

(86) PCT No.: PCT/FR2004/050081

§ 371 (c)(1),
(2), (4) Date: Aug. 18, 2005

(87) PCT Pub. No.: WO2004/079379

PCT Pub. Date: Sep. 16, 2004

(65) Prior Publication Data

US 2006/0145705 A1    Jul. 6, 2006

(30) Foreign Application Priority Data

Feb. 27, 2003   (FR)   ................................. 03 02388

(51) Int. Cl.
*G01R 31/08*   (2006.01)
(52) U.S. Cl. ........................ 324/536; 324/522; 324/515; 324/520
(58) Field of Classification Search ................ 324/536, 324/522, 515, 520; 340/635, 657
See application file for complete search history.

(56) References Cited

U.S. PATENT DOCUMENTS

| | | | | |
|---|---|---|---|---|
| 4,617,513 A | * | 10/1986 | Reinhardt | ................... 324/126 |
| 4,942,377 A | * | 7/1990 | Ishikawa et al. | ............ 333/202 |
| 5,166,600 A | * | 11/1992 | Gorablenkow | ............... 324/126 |
| 5,700,745 A | * | 12/1997 | Okuyama et al. | ........... 501/134 |
| 5,804,972 A | | 9/1998 | De Kock et al. | |
| 5,854,556 A | * | 12/1998 | Steennis et al. | ............ 324/541 |
| 6,323,655 B1 | | 11/2001 | Fu et al. | |
| 6,340,890 B1 | * | 1/2002 | Bengtsson et al. | .......... 324/536 |
| 6,489,782 B1 | * | 12/2002 | Baier et al. | .................. 324/551 |
| 6,873,161 B1 | * | 3/2005 | Meckler et al. | ............. 324/536 |
| 2002/0024341 A1 | | 2/2002 | Rokunohe et al. | |

FOREIGN PATENT DOCUMENTS

EP          0 984 289          3/2000
JP      2005-338016 A    * 12/2005

OTHER PUBLICATIONS

Fink, Donald, Standard Handbook for Electrical Engineers, McGraw-Hill, 1968, p. 4-126.*

* cited by examiner

*Primary Examiner*—Andrew Hirshfeld
*Assistant Examiner*—Thomas Valone
(74) *Attorney, Agent, or Firm*—Oblon, Spivak, McClelland, Maier & Neustadt, P.C.

(57) ABSTRACT

A sensor for picking up partial discharges in an electrical equipment tank filled with a dielectric fluid includes an antenna responsive to the electromagnetic waves generated by such partial discharges. In the sensor, the antenna is formed by two electrodes that are separated from each other by a dielectric resonator. With this arrangement, the sensor has improved sensitivity in the UHF range, while being of dimensions that are considerably smaller than dimensions of a conventional antenna for use in the UHF range.

8 Claims, 3 Drawing Sheets

ANTENNA FOR DETECTION OF PARTIAL DISCHARGES IN A CHAMBER OF AN ELECTRICAL INSTRUMENT

The invention relates to a sensor for detecting partial discharges in an electrical equipment tank filled with a dielectric fluid, the sensor comprising an antenna capable of picking up the electromagnetic waves generated by such partial discharges.

BACKGROUND OF THE INVENTION

These waves occupy a spread of frequencies extending from the high frequency range (HF) to the ultrahigh frequency range (UHF), the highest frequencies being capable of reaching approximately 2 gigahertz (GHz) if the dielectric fluid is a gas, and approximately 1.5 GHz if the fluid is a liquid.

For several years, measurements have commonly been performed in the HF and very high frequency (VHF) frequency ranges to detect the impulses of partial electric discharges in electrical equipment installed in a casing filled with a dielectric fluid (a liquid or a gas), but that technique presents drawbacks. Corona discharges taking place in the vicinity of the equipment generate high intensity electromagnetic waves in the same HF and VHF frequency ranges up to about 200 megahertz (MHz) and that significantly interferes with the measurements.

Thus, in order to improve the quality of such measurements, it is necessary to perform them in the UHF frequency range so as to be unaffected by disturbances due to corona discharges. U.S. Pat. No. 5,804,972 describes a device for detecting partial electric discharge impulses in gas-insulated metal-clad electrical equipment by means of a UHF antenna installed inside the equipment and having one electrode mounted on the casing of the equipment. The transfer function of such an antenna is relatively high and flat in a UHF frequency band extending typically from 300 MHz to 1.8 GHz.

No provision is made in that device to be able to remove the antenna from its housing without temporarily taking the equipment out of service, since removing the antenna requires sealing between the gas inside the casing and the outside air to be broken.

The possibility of removing such an antenna for detecting partial discharge impulses from its housing does exist elsewhere in the field of electrical equipment such as transformers placed in a tank filled with a dielectric liquid such as oil.

A partial discharge sensor capable of being inserted through an emptying valve as far as an opening in the tank is described in U.S. Pat. No. 6,323,655. Such a sensor includes an antenna, e.g. a spiral antenna, and it can be installed and withdrawn without it being necessary to take the transformer out of operation. It further includes a bushing for coupling to the emptying valve, with the antenna being mounted on a support that is capable of sliding in said bushing inside the emptying valve. Thus, the sensor can be used in succession on a plurality of identical valves occupying different positions of the tank of a piece of oil-insulated electrical equipment without it being necessary to interrupt operation of the equipment.

That antenna is of a size that is smaller that the diameter of the emptying valve so as to enable it to pass along the bore of the valve. It should be observed that the transfer function of the antenna is inversely proportional to frequency and varies in the same direction as valve diameter. Unfortunately, the valves commonly used for transformers in oil-insulated tanks possess bores of relatively small diameter, typically less than 50 millimeters (mm). The sensor can thus have a transfer function which remains satisfactory in the HF and VHF frequency ranges, but which becomes poor for UHF frequencies. This deterioration leads to values that are too small for providing an antenna signal that is genuinely useful, and also gives rise to a multitude of resonance peaks which make it impossible to use any antenna signal properly.

If the sensor is fitted with a spiral antenna, adapting it to ultrahigh frequencies requires a spiral of a diameter greater than the diameter of emptying valves that are commonly installed, which means that it is not possible to pass the sensor through the valve.

OBJECTS AND SUMMARY OF THE INVENTION

An object of the invention is to remedy those drawbacks by providing a sensor of relatively small dimensions and which presents a transfer function that is satisfactory in the ultrahigh frequency range, thus making it possible to perform accurate measurements of partial discharges by placing the sensor in any available opening in the tank of the electrical equipment, for example in an emptying valve in the tank of an oil-insulated transformer.

For this purpose, the invention provides a sensor for detecting partial discharges in an electrical equipment tank filled with a dielectric fluid, the sensor comprising an antenna sensitive to the electromagnetic waves generated by such partial discharges, wherein said antenna is formed by two electrodes separated by a dielectric resonator. This makes it possible to make accurate measurements of partial discharges using a sensor that is adapted to be inserted, in particular into an emptying valve.

In a preferred embodiment, the first electrode is in the form of a disk, the second electrode is in the form of a truncated cone having plane ends, and the dielectric resonator is in the form of a cylinder, the first electrode, the resonator, and the second electrode being spaced apart along an axis of symmetry and being embedded in a cylindrical bar of dielectric material. It has been found that using a second electrode in the form of a truncated cone improves the sensitivity of the antenna in the 0.5 GHz to 1 GHz frequency range, and that the dimensioning of the resonator has a preponderant influence on sensitivity at frequencies situated in the 0.2 GHz to 0.5 GHz range. In analogous manner, various tests and simulations have shown that selecting a material having relative dielectric permittivity lying in the range 1 to 3 for the resonator, and a material for embedding the antenna having relative dielectric permittivity lying in the range 3 to 5 serves to optimize performance.

Advantageously, the sensor of the invention is made with a first electrode of copper, a second electrode of aluminum, and a resonator of polytetrafluoroethylene, all three embedded in a bar of epoxy resin, thus enabling the sensor to be manufactured at very low cost.

BRIEF DESCRIPTION OF THE DRAWINGS

The invention is described below in greater detail and with reference to the accompanying drawings which show an embodiment by way of non-limiting example.

MORE DETAILED DESCRIPTION

Figure 1:
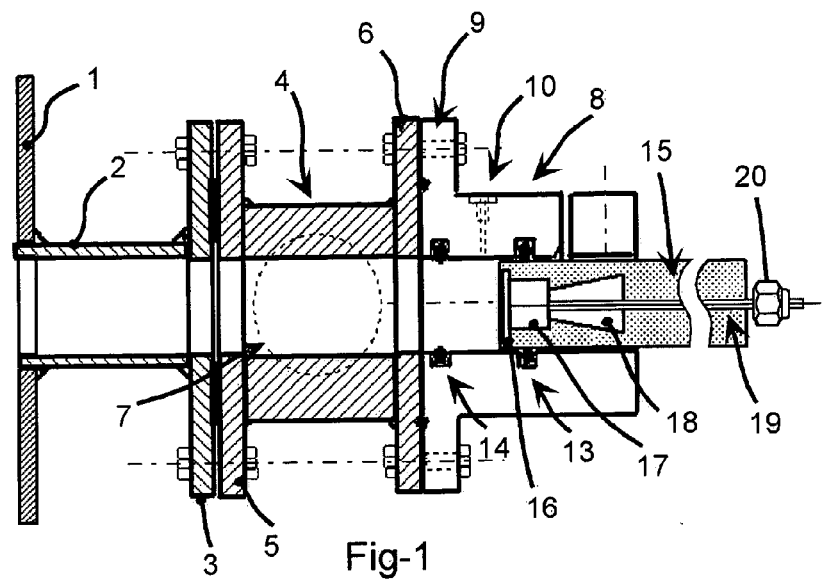
FIG. 1 is a section view of an emptying valve while a sensor of the invention is being inserted therein.
Figure 2:
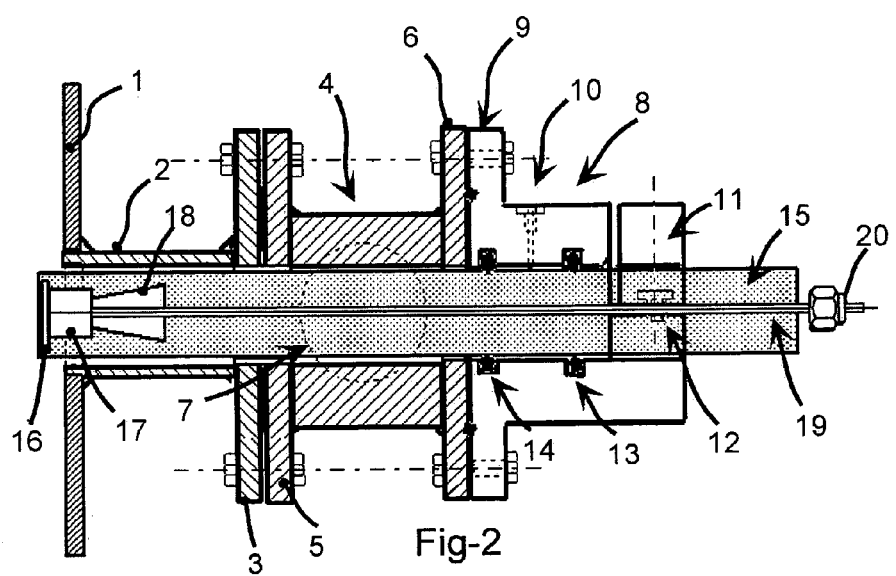
FIG. 2 is a section view of an emptying valve while the sensor of the invention is in position therein.

FIGS. 1 and 2 show a transformer tank 1 containing oil (not shown), said tank 1 having a channel 2 welded to its outside wall, the channel supporting a flange 3 having an emptying valve 4 fixed thereto. The valve 4 has two flanges 5 and 6 welded to each of its ends, respectively, the flange 5 being connected in leaktight manner to the flange 3 of the channel 2 by being fixed using peripheral bolts. In this example, the valve 4 has a ball plug 7 which is represented by dashed lines. Such an emptying valve is generally provided near the bottom of an oil-filled transformer tank in order to enable the oil to be removed therefrom when it needs to be changed, or when the transformer needs to be tested. A bushing 8 of generally cylindrical shape is situated in line with the valve 4 and includes a flange 9 at one of its ends. This flange is connected to the flange 6 of the valve 4 by means of a plurality of peripheral bolts each passing through both flanges 6 and 9.

The assembly constituted by the channel 2, the valve 4, and the bushing 8 thus defines an internal bore having a certain diameter, for example substantially equal to 40 mm, and capable of receiving a sensor 15 of the invention which is generally cylindrical in shape having an outside diameter that is slightly smaller than the inside diameter of the bore. The bushing 8 also includes a vertical vent 10 capable of being closed by a screw, two O-rings 13 and 14 that are spaced apart from each other, being situated in the inside periphery of the bore for the purpose of providing sealing between the sensor 15 and the inside bore. A collar 11 made in the body of the bushing 8 and associated with a bolt 12 is situated at the free end of the bushing 8 so as to enable the sensor of the invention to be fixed by clamping inside the bushing 8.

Figure 3:
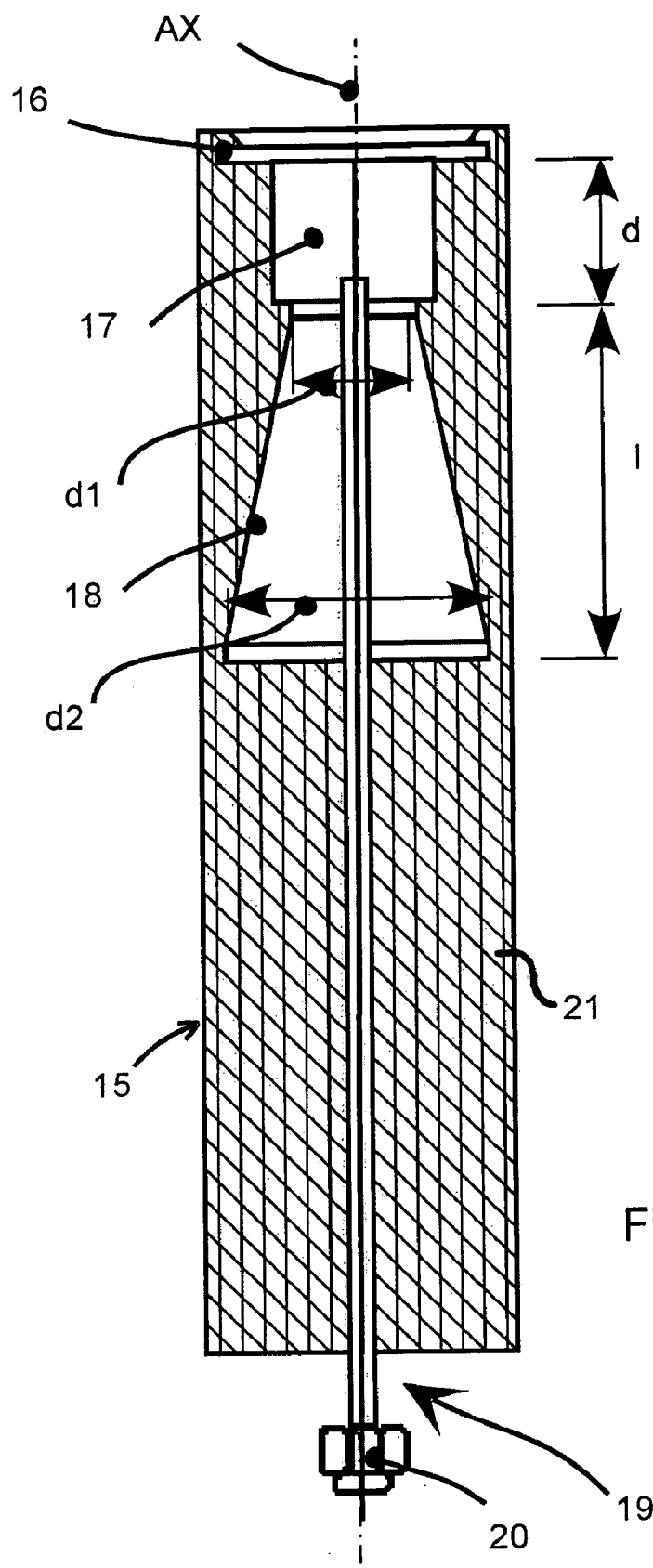
FIG. 3 is a section view of the sensor of the invention.

The sensor 15 as shown in section in FIG. 3 is of cylindrical outside shape extending along an axis of symmetry AX. In accordance with the invention, the sensor comprises an antenna constituted by a first electrode 16 situated at the end of the sensor, and by a second electrode 18 spaced apart from the first electrode along the axis AX, and separated therefrom by a piece 17 of dielectric material which forms a resonator. It has been found that using such a resonator significantly improves the sensitivity of the antenna for a given frequency range of interest. More particularly, the presence of the resonator makes it possible to reduce significantly the dimensions of the antenna compared with conventional designs, while retaining satisfactory sensitivity.

In a conventional antenna, i.e. not having a resonator between its two electrodes, the laws of physics mean that its size T (corresponding substantially to its largest dimension) is related to the frequency f at which it is sensitive by the relationship T=142/f, where f is frequency in MHz and T is size in mm. When this condition is not satisfied, the transfer function of the antenna is significantly deteriorated. Consequently, a conventional antenna sensitive in the frequency range 0.2 GHz to 1 GHz needs to have a size T situated around 742 mm. Using a spiral antenna as in the embodiment described by U.S. Pat. No. 6,323,655, this condition implies that the diameter of the antenna is to be of the same order as said size. This is not compatible with the most widespread diameters for emptying valves fitted to transformer tanks.

However, in the invention, by interposing a resonator between the two electrodes 16 and 18, it is possible to reduce significantly the distance between them or to reduce the diameter of the antenna, depending on the type of conventional antenna used for comparison purposes, while nevertheless retaining satisfactory sensitivity in the frequency range of interest. Thus, the antenna of the sensor 15 of the invention may have a diameter of substantially 40 mm while still presenting sensitivity that is satisfactory at frequencies lying in the range 0.2 GHz to 1 GHz, as described in detail below.

In a preferred embodiment, the first electrode 16 is in the form of a disk and it is situated at one of the ends of the sensor, while the second electrode 18 is in the form of a truncated cone having plane ends. These two electrodes are spaced apart from each other along the axis AX, the second electrode 18 in the form of a truncated cone being disposed in such a manner that its smaller-diameter base faces the first electrode 16 while its larger-diameter base is further away from the first electrode 16 along the axis AX.

In this case, the first electrode 16 is a disk having a thickness of 0.25 mm and a diameter of 36 mm, for example, for use with a valve having a bore of 40 mm, and the free face of the disk is flush with the end of the sensor. It should be observed that in general, the transfer function of the antenna decreases with increasing thickness of the disk of the electrode 16. It has been found that this decrease becomes significant for a thickness of more than 5 mm, while it remains accessible in the range 0.25 mm to 5 mm. In order to reconcile a satisfactory level for the transfer function with satisfactory mechanical strength for the disk of the electrode 16, it is preferable for the thickness of the disk to lie in the range 0.25 mm to 5 mm.

In this example, the first electrode 16 is made of copper, but other materials could also be used to make it.

The second electrode 18 which is in the form of a truncated cone having two plane ends is made of aluminum so as to ensure that its dielectric permittivity is high, tests having shown that this permittivity has an important contribution to the sensitivity of the sensor to electromagnetic waves. The larger diameter of this frustoconical electrode is close to the diameter of the disk-shaped, first electrode 16. In the example shown in the figures, the cone is hollow, being made as a hollow truncated cone with two disks, likewise made of aluminum, fitted to its respective ends.

This electrode could also be made in the form of a solid truncated cone, and that would not harm the performance of the sensor. The diameters and the length of this frustoconical, second electrode 18 are selected so as to optimize the sensitivity of the antenna, as described in greater detail below.

These electrodes are separated along the axis AX by a resonator 17 made of dielectric material, thereby significantly improving the sensitivity of the antenna in the ultra high frequency range. This resonator 17 is in the form of a cylinder about the axis AX, and it is made of a material whose permittivity is selected so as to maximize the sensitivity of the antenna in the 0.2 GHz to 0.5 GHz frequency range. In this example, the cylindrical resonator has a diameter that lies between the smaller diameter d1 and the larger diameter d2 of the conical electrode 18.

Tests and simulations show the influence of the dimensions and the relative positions of the components of the sensor on its transfer function.

The length l of the conical electrode along the axis AX determines the frequency at which the transfer function presents a minimum level. More particularly, the frequency at which this minimum appears is higher with decreasing length l. In general, the length l should lie in the range 20 mm to 150 mm, and preferably in the range 30 mm to 100 mm. In the embodiment shown in the figures, the length l is 40 mm thus placing the minimum of the transfer function at a frequency above 1.5 GHz, as shown in dashed lines in FIG. 4, thereby ensuring that the transfer function is satisfactory over the entire range of frequencies from 2000 MHz to 1.5 GHz.

The distance $\underline{d}$ between the first electrode in the shape of a disk and the conical electrode, i.e. the distance which corresponds substantially to the thickness of the resonator, has an influence on the frequency at which the transfer function has a local maximum. The greater this distance $\underline{d}$, the lower the frequency of this maximum in the transfer function. When the length $\underline{d}$ lies in the range 10 mm to 60 mm, the frequency of the maximum appears in the range 0.3 GHz to 0.6 GHz. In the example shown in the figures, this distance $\underline{d}$ is 5 mm and the frequency of the maximum in the transfer function is situated at about 0.5 GHz.

The ratio of the larger diameter d2 over the smaller diameter d1 has an influence on the mean value of the transfer function over the entire frequency range of interest, and on the frequency at which the transfer function has a maximum. Qualitatively, the smaller this ratio, i.e. the greater d1, the higher the mean value and the higher the frequency of the maximum. This ratio is advantageously selected to lie in the range 2.5 to 4.5 so as to obtain a mean height for the transfer function lying in the range 3.5 mm to 4 mm, as explained in greater detail below.

In analogous manner, the materials selected to constitute the resonator and the epoxy resin in which the components of the antenna are embedded have an effect on the quality of the transfer function of the sensor. In the example shown in the figures, the material selected for the resonator is polytetrafluoroethylene whose relative permittivity is very low, being situated at about 2. Epoxy resin presents relative dielectric permittivity of about 4. More generally, tests have shown that a value in the range 1 to 3 for the resonator and a value in the range 3 to 5 for the epoxy resin lead to a transfer function that is usable in the frequency range of interest.

These two electrodes 16 and 18 are connected to measuring equipment situated outside the sensor 15 by means of a coaxial cable 19 which passes along the sensor, lying substantially on its axis of symmetry AX. The inner conductor of the coaxial cable is connected to the electrode 16 and the conducive outer shield of the coaxial cable is connected to the electrode 18. The assembly constituted by the electrodes 16 and 18 and the resonator 17 is molded in a cylindrical structure of dielectric material which does not interfere with the transfer function of the antenna in the frequency range of interest. Advantageously, this assembly is molded in a bar of epoxy resin so as to be manufactured at low cost.

Figure 4:
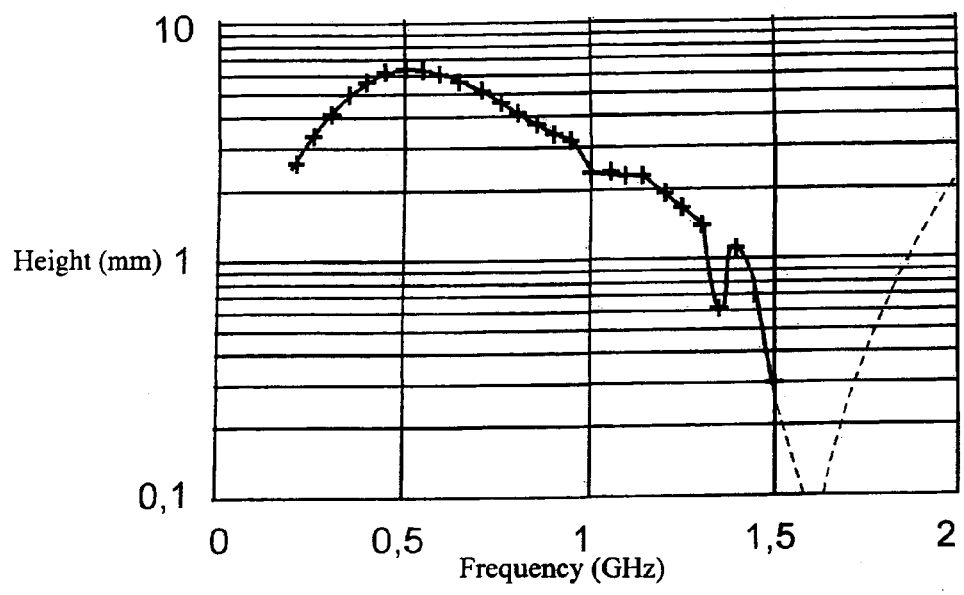
FIG. 4 is a graph showing the transfer function of the sensor of the invention.
Figure 5:
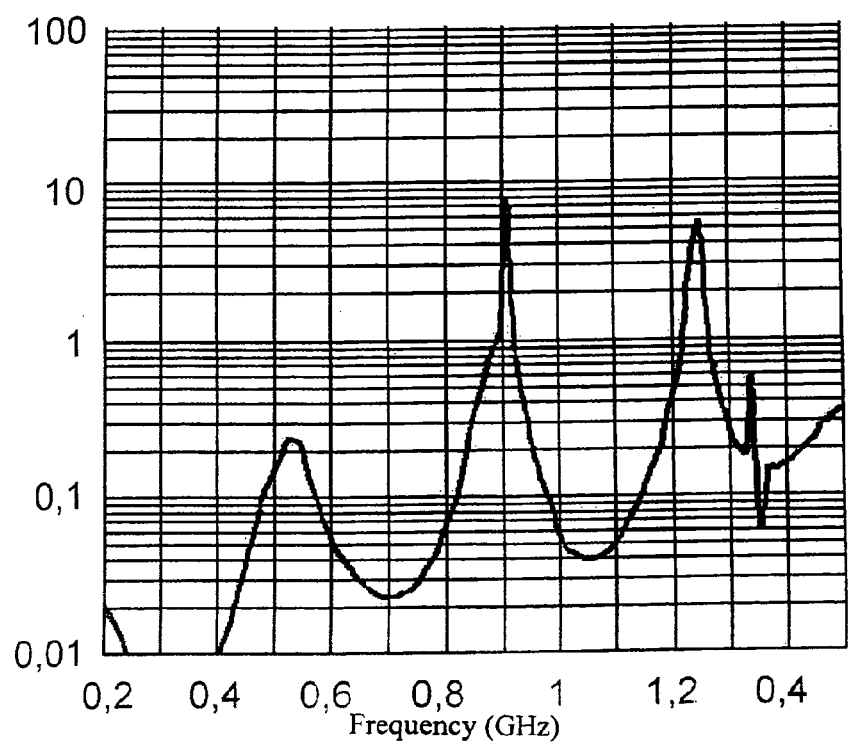
FIG. 5 is a graph showing the transfer function of a prior art sensor.

FIG. 4 shows the transfer function of the sensor 15 of the invention. It is plotted in the form of a height in millimeters as a function of frequency in GHz for the electric field being measured. This height (in millimeters) corresponds to the ratio of the voltage measured at the output of the sensor divided by the amplitude of the corresponding electric field in volts per meter. As can be seen in the figure, the transfer function is greater than 2 mm in the frequency range 0.2 GHz to 1 GHz, with its mean value being 4.6 mm. This transfer function is also very regular within this frequency range; it does not present any particular peaks. By way of comparison, FIG. 5 shows the transfer function of the sensor disclosed in U.S. Pat. No. 6,323,655. That other transfer function is very low for frequencies lying in the range 0.2 GHz to 0.85 GHz, and it presents a plurality of resonance peaks, one of which is as high as 10 mm for a frequency of 0.9 GHz. That transfer function has a multitude of other resonance peaks, such that the sensor is not usable in the frequency range of interest.

Installing the sensor in an emptying valve is described below. The bushing 9 is initially connected to the flange 6 by being fixed thereto with bolts. The collar 11 and the screw 12 are loose at this stage, and the emptying valve is closed. The sensor 15 containing the antenna is inserted into the free end of the bushing 8 until its first end comes up to the O-ring 13. The emptying valve 4 is then opened and the vent 10 is opened to release the air held captive in the bushing, possibly together with a small quantity of oil. The vent 10 is then reclosed by screwing the corresponding screw back into its housing. The emptying valve is then opened fully so as to allow the sensor 15 to pass through it. The sensor is then pushed so as to pass through the O-ring 14 until the end of the sensor containing the antenna reaches the inside of the tank 1 so as to coincide with the inside surface thereof.

The end of the sensor 15 may advantageously penetrate a short distance inside the inside surface of the tank 1 so as to further improve its transfer function. The penetration depth is a function of the position of the emptying valve relative to the tank 1 and of the structure of the transformer. It should be observed that penetration of 10 mm is satisfactory when the emptying valve is close to the ground of the internal windings. Once the appropriate position has been reached, the collar 11 is tightened onto the sensor by means of the screw 12 so as to ensure that the sensor occupies a stable position relative to the emptying valve. After performing a measurement campaign, the sensor 15 is withdrawn from the emptying valve in the opposite order to that described above.

The relative compactness of a sensor of the sensor is advantageous not only for installation in a valve for emptying a dielectric liquid, but also for installation in the metal casing of metal-clad electrical equipment that is gas-insulated.

The invention claimed is:

1. A sensor for detecting partial discharges in an electrical equipment tank filled with a dielectric fluid, the sensor comprising:
   an antenna sensitive to electromagnetic waves generated by the partial discharges,
   wherein the antenna is formed by first and second electrodes separated by a dielectric resonator,
   wherein the first electrode is in a form of a disk, wherein the second electrode is in a form of a truncated cone having plane ends, and wherein the dielectric resonator is in a form of a cylinder, the first electrode, the resonator, and the second electrode being spaced apart along an axis of symmetry and being embedded in a cylindrical bar of dielectric material.

2. A sensor according to claim 1, further comprising a coaxial cable with an inner conductor connected to the first electrode and an outer conductive shield connected to the second electrode.

3. A sensor according to claim 1, wherein the first electrode and the second electrode are spaced apart along the axis by a distance lying in a range of 10 mm to 60 mm.

4. A sensor according to claim 1, wherein the ends of the second electrode have respectively a smaller diameter and a larger diameter in a ratio lying in a range of 2.5 to 4.5, and are spaced apart by a length lying in a range of 30 mm to 100 mm.

5. A sensor according to claim 1, wherein the resonator of cylindrical shape has a diameter lying between a smaller diameter and a larger diameter of ends of the conical electrode.

6. A sensor according to claim 1, wherein the resonator is made of a material having relative dielectric permittivity lying in a range of 1 to 3.

7. A sensor according to claim 1, wherein the cylindrical bar is made of a material having relative dielectric permittivity lying in a range of 3 to 5.

8. A sensor according to claim 1, wherein the first electrode is made of copper, the second electrode is made of aluminum, the resonator is made of polytetrafluoroethylene, and the first electrode, the second electrode, and the resonator are all embedded in a bar made of epoxy resin.

* * * * *